(12) United States Patent
Robert

(10) Patent No.: US 8,422,977 B2
(45) Date of Patent: Apr. 16, 2013

(54) PROGRAMMABLE FILTER

(75) Inventor: Sebastien Robert, Emieville (FR)

(73) Assignee: NXP B.V., Eindhoven (NL)

( * ) Notice: Subject to any disclaimer, the term of this patent is extended or adjusted under 35 U.S.C. 154(b) by 41 days.

(21) Appl. No.: 13/117,325

(22) Filed: May 27, 2011

(65) Prior Publication Data

US 2011/0294454 A1    Dec. 1, 2011

(30) Foreign Application Priority Data

May 27, 2010   (EP) .................................... 10290281

(51) Int. Cl.
 *H04B 1/26* (2006.01)
(52) U.S. Cl.
 USPC ..................... 455/323; 455/150.1; 455/191.3; 455/194.2; 455/307; 455/341; 330/263; 330/265
(58) Field of Classification Search ................. 455/323, 455/150.1, 341, 191.3, 194.2, 307; 330/263, 330/265
See application file for complete search history.

(56) References Cited

U.S. PATENT DOCUMENTS

| 6,130,590 | A | 10/2000 | Kolsrud | |
| 7,251,466 | B2 * | 7/2007 | Porret et al. | 455/190.1 |
| 7,715,813 | B2 * | 5/2010 | Heng | 455/150.1 |
| 8,116,690 | B2 * | 2/2012 | Rofougaran et al. | 455/66.1 |
| 2005/0159129 | A1 | 7/2005 | Iida | |
| 2005/0220224 | A1 | 10/2005 | Dornbusch | |
| 2006/0040628 | A1 | 2/2006 | Porret et al. | |
| 2007/0140391 | A1 | 6/2007 | Pan | |
| 2009/0042524 | A1 | 2/2009 | Maiuzzo | |
| 2010/0085490 | A1 | 4/2010 | Chen | |

FOREIGN PATENT DOCUMENTS

| EP | 0 909 481 B1 | 12/2003 |
| WO | 2009/057051 A2 | 5/2009 |

OTHER PUBLICATIONS

Extended European Search Report for European Patent Application No. 10290281.4 (Nov. 24, 2010).

* cited by examiner

*Primary Examiner* — Sanh Phu

(57) ABSTRACT

The invention relates to a programmable filter for a radiofrequency receiver, embodiments disclosed including a filter (600) comprising an input (601) for receiving a radiofrequency signal, an output (602) for providing a filtered version of the input radiofrequency signal and a plurality of filter paths (603*a-c*) connected in parallel between the input (601) and output (602), each filter path comprising a buffer (604*a-c*) connected between the input (601) and one or more polyphase filters (605*a-f*), wherein each of the plurality of filter paths (603*a-c*) is configured to be individually selectable by providing an enable signal to a corresponding one of the buffers (604*a-c*).

17 Claims, 7 Drawing Sheets

PROGRAMMABLE FILTER

CROSS-REFERENCE TO RELATED APPLICATIONS

This application claims the priority under 35 U.S.C. §119 of European patent application no. 10290281.4, filed on May 27, 2010, the contents of which are incorporated by reference herein.

The invention relates to a programmable filter for a radiofrequency receiver.

In silicon tuners for use with radiofrequency (RF) receivers, in particular for reception of television signals, a low intermediate frequency (IF) architecture is typically used. A complex mixer in conjunction with polyphase filters can be employed to provide a good image rejection, as for example disclosed in EP0909481. In this configuration an RF polyphase filter generates a quadrature signal and provides some rejection of the 4N−1 harmonics (where N is a positive integer, i.e. N>0), but with no rejection of the 4N+1 harmonics.

Several alternatives are also known that improve the harmonic rejection in complex mixer systems. Harmonic rejection mixers can be used to prevent from harmonics down mixing, as for example disclosed in WO 2009/057051. A quadrature generator with harmonic rejection in disclosed in US 2005/0159129, which is similar to that disclosed in EP0909481.

US 2007/0140391 discloses a complex bandpass-notch filter providing both bandpass filtering and image rejection in complex frequency domain along with quadrature signal generation.

US 2005/0220224 discloses a polyphase filter with parallel buffers arranged between first and second polyphase filter sections, the filter sections being configured such that the passband response of the second filter section compensates for the passband response of the first filter section.

U.S. Pat. No. 6,130,590 discloses a programmable filter bank comprising a set of interconnected individually selectable filter elements, where each filter element provides a pre-determined fixed frequency response, a control unit being connected to the filter elements to enable selection of one or more filter element to generate a desired overall frequency response.

US 2009/0042524 discloses a wideband receiver comprising a comb limited combiner, a received signal being divided up into sub-bands by a bank of bandpass filters, each sub-band being digitized and subjected to digital signal processing, a threshold set such that any frequency with a magnitude exceeding a threshold is excised in the frequency domain.

FIG. 1 illustrates a passive polyphase filter circuit 100 made of resistors R and capacitors C, in which the filter is configured to have a negative zero. A differential input signal In+, In− is provided at one side of the filter 100, which is transformed into in-phase and quadrature signals Iout+, Qout−, Iout−, Qout+. The circuit 100 may therefore be considered to be a quadrature generator.

Considering that the input signal In=In+−In−, and the output signals Iout=Iout+−Iout− and Qout=Qout+−Qout−, the transfer function of the quadrature generator 100 of FIG. 1 is given by:

$$\frac{Iout + jQout}{In} = -(1+j)\frac{\left(p + \frac{j}{RC}\right)}{\left(p + \frac{1}{RC}\right)}$$

The above transfer function, which is in the Laplace domain where p=jω, shows that a negative zero, at p=−j/RC, is present on the imaginary axis, which corresponds to a negative frequency notch, i.e. a notch in the voltage gain transfer function at a frequency of −1/(2πRC).

A passive polyphase filter 200 having a negative zero is illustrated in FIG. 2, in which four inputs 201a-d (which correspond with the four outputs of the filter of FIG. 1) are connected to four outputs 202a-d. An alternative passive polyphase filter 300 having a positive zero is illustrated in FIG. 3, in which four inputs 301a-d are connected to four outputs 302a-d. Combinations of the filters of FIGS. 1, 2 and 3 can be used to provide a desired filter combination having positive and negative notches to an input signal.

Illustrated in FIG. 4a is a typical arrangement of polyphase filters for a filter module 400 of a television receiver. The filter module 400 comprises polyphase filters 401a-d arranged in series, with buffers 402a-c connected between different ones of the polyphase filters 401a-d. A first polyphase filter 401a, corresponding to the filter 100 of FIG. 1, applies a negative notch (indicated by −f1), and generates a quadrature signal from a differential input signal. Further polyphase filters 401b, 401c and 401d, each corresponding to the filter 200 of FIG. 2, apply different negative notches −f2, −f3, −f4 to the quadrature signal. Unity gain voltage buffers 402a-c are connected between the polyphase filters 401a-d in order to ensure an impedance match, so that the overall gain of the filter module 400 is maintained at or near 0 dB. Connections to each filter and buffer shown in FIG. 4a represent multiple connections. An alternative representation of the filter module 400 is shown in FIG. 4b, in which these multiple connections are shown, the buffers 402a-c being illustrated as separate buffers for each connection to and from polyphase filters 401a-d.

The filter module 400 allows the input signal to be filtered in order to, for example, remove known harmonics. The filter module 400 does not, however, allow the position of the filter notches to be changed, for example in order to filter out different harmonics when a different signal is to be received.

A polyphase filter of the type illustrated in FIGS. 1 to 3 may however be configured to have a variable notch frequency. An example of such a programmable polyphase filter 500 is illustrated in FIG. 5. Variable resistors 501a-d are used in place of the fixed resistors in the polyphase filters of FIGS. 1-3. In order to implement such a polyphase filter in silicon, the variable resistors are implemented as resistor networks with controllable switches. A disadvantage of this approach, however, is that the use of switched resistor networks tends to result in severe degradation of linearity of the filter.

It is an object of the invention to address one or more of the above mentioned problems.

In accordance with a first aspect of the invention there is provided a programmable filter for a radiofrequency receiver, the programmable filter comprising:
  an input for receiving a radiofrequency signal;
  an output for providing a filtered version of the input radiofrequency signal; and
  a plurality of filter paths connected in parallel between the input and output, each filter path comprising a buffer connected to the input and one or more polyphase filters, wherein each of the plurality of filter paths is configured to be individually selectable by providing an enable signal to a corresponding one of the buffers.

An advantage of the invention is that the filter is programmable and can therefore be adjusted to apply different frequency notches to the input signal, but without the disadvantage of using a switched resistor network. Instead, using switched buffers on each parallel path allows a chosen filter path to be selected and the other filter paths to be isolated, thereby minimising their effect on the output signal.

The input is preferably configured to receive a differential input radiofrequency signal, which may be converted to a quadrature signal, resulting in the filter providing a quadrature signal at the output. Each of the polyphase filters in the filter paths are preferably passive, for example composed of resistors and capacitors. Using passive polyphase filters has the advantage of minimising signal degradation from the input to the output.

The buffer of each filter path is preferably connected to the input via a common passive polyphase filter, which may be configured to receive a differential input radiofrequency signal and output a quadrature signal to each of the buffers of the filter paths.

The buffer of each filter path may be configured to have a unity voltage gain when enabled by the enable signal, and may be configured to isolate the filter path from the input when not enabled.

With the buffer of each filter path considered to be a first buffer, each filter path may comprise a second buffer connected between the one or more polyphase filters and the output of the filter. The second buffer of each path may be configured to have a unity voltage gain when enabled by an enable signal. Preferably, the same enable signal is provided to the first and second buffers, so that the selected filter path is chosen and the other filter paths are isolated from the selected path between the input and output.

The one or more polyphase filters in each filter path may comprise a positive or a negative notch filter, i.e. a filter having a notch in its voltage gain transfer function at a positive or negative frequency.

The filter preferably also comprises a controller module coupled to the buffer of each filter path, the controller module being configured to provide the enable signal to a selected one of the buffers (or to a selected pair of first and second buffers) in dependence on a selected radiofrequency channel. The filter is thereby configured to be automatically adjustable depending on a selection of a radiofrequency channel, which allows the particular filtering requirements of different channels to be accommodated.

Each buffer of the programmable filter may comprise a buffer circuit for each phase of the polyphase filter path.

According to an embodiment of the invention there is provided a radiofrequency receiver comprising a filter according to an embodiment within the first aspect and a mixer, an input of the mixer being connected to the output of the filter and to a local oscillator signal source for converting a selected radiofrequency signal to an intermediate frequency signal.

In accordance with a second aspect of the invention there is provided a method of operating a programmable filter for a radiofrequency receiver according to the above embodiment, the method comprising:
 receiving a radiofrequency signal at the input of the filter;
 selecting one of the filter paths by providing an enable signal to one of the buffers; and
 providing a filtered output signal at the output of the filter.

When one filter path of the filter is used by enabling the associated buffer(s), the other filter paths are disconnected by disabling the unity voltage gain buffers of these unused paths, placing them in a power down mode. An advantage of this is that the power consumption of the filter stays low and approximately constant regardless of which filter path is chosen.

One or more paths of the polyphase filter contain at least one positive notch, which may be configured to reject a 4N+1 harmonic signal. This positive notch can also be used to reject any other unwanted signal.

The polyphase path is chosen according to the frequency of the wanted channel. A frequency table may be provided in an embedded memory. Consequently a receiver comprising the filter can be configured to be auto-adaptive and harmonic rejection is maximized regardless of the frequency of the wanted channel.

The filter also has the advantage of having constant input impedance whatever the programmed transfer function, by using a single polyphase filter common to all filter paths, resulting in a constant input impedance regardless of which path is selected.

The use of parallel connected filter paths has the advantage of having a minimal impact on the gain and distortion of the filter. The current consumption of the polyphase filter is constant whatever the programmed transfer function.

Each filter path may have a different transfer function. For example, one filter path may have a negative notch in its transfer function, whereas another path may have a positive notch in its transfer function.

Exemplary embodiments according to aspects of the invention are described in further detail below, and with reference to the accompanying drawings in which.

FIGS. 1 to 5 have already been described in relation to the background to the invention provided above.

Figure 1:
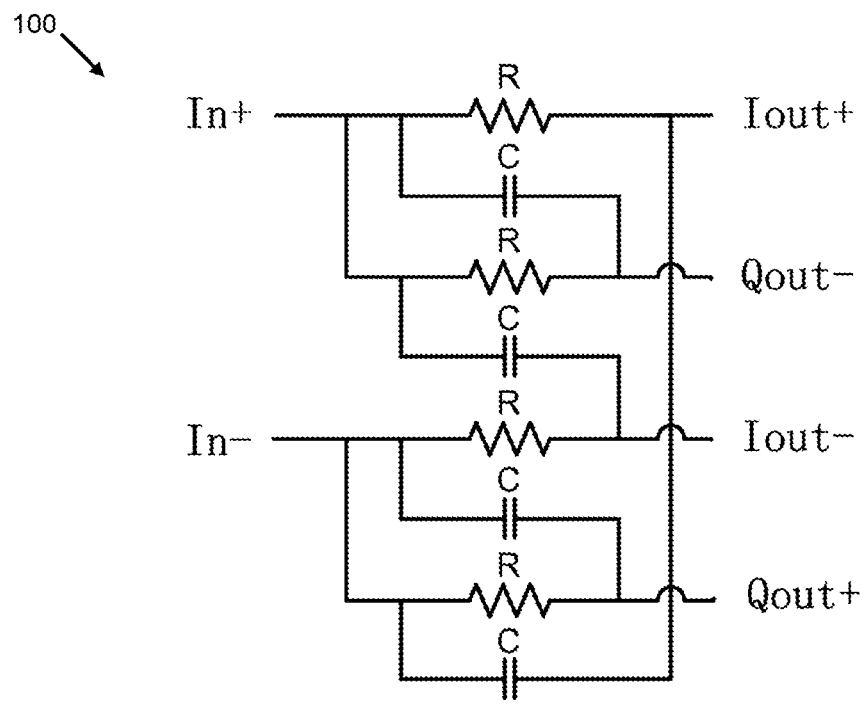
FIG. 1 is a circuit diagram of a passive polyphase filter section composed of resistors and capacitors and having a negative zero, in which a differential input is converted to a quadrature signal.
Figure 2:
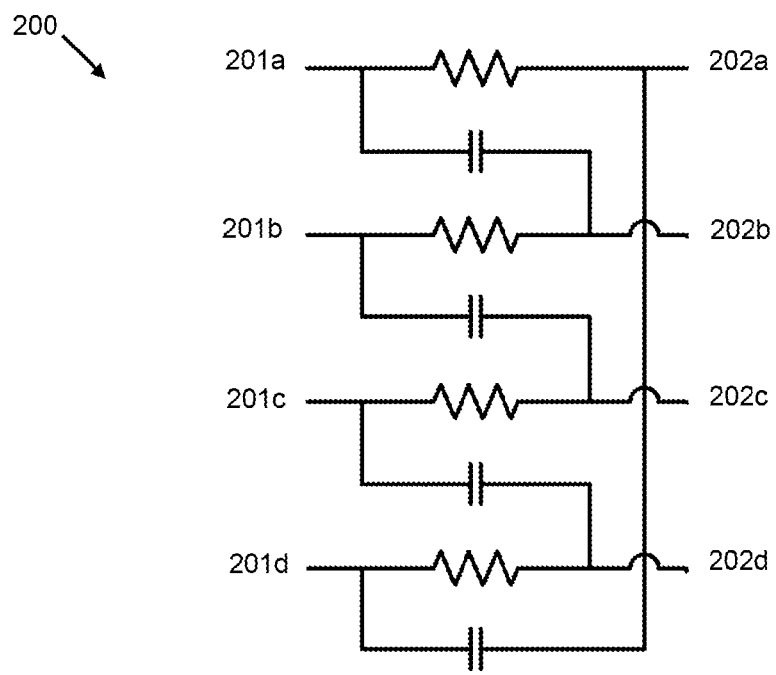
FIG. 2 is a circuit diagram of a further passive polyphase filter in which the resistors and capacitors are arranged to provide a filter with a negative zero.
Figure 3:
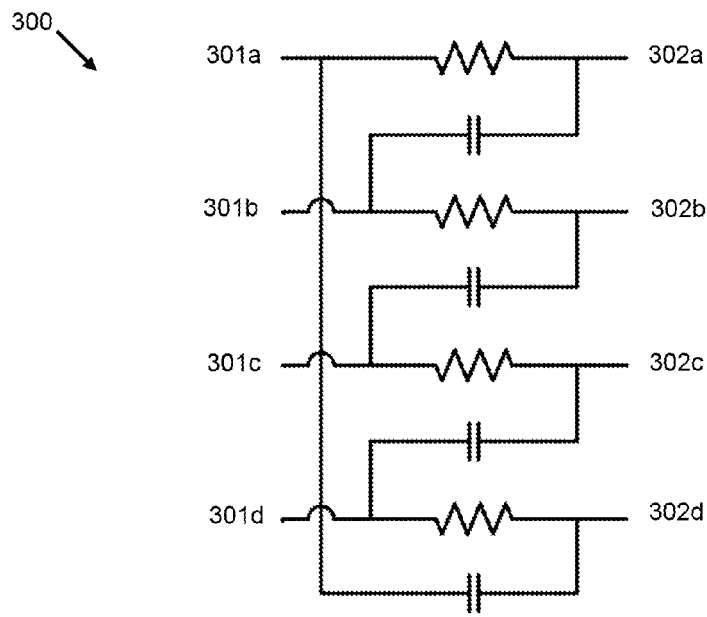
FIG. 3 is a circuit diagram of a further passive polyphase filter in which the resistors and capacitors are arranged to provide a filter with a positive zero.
Figure 4A:
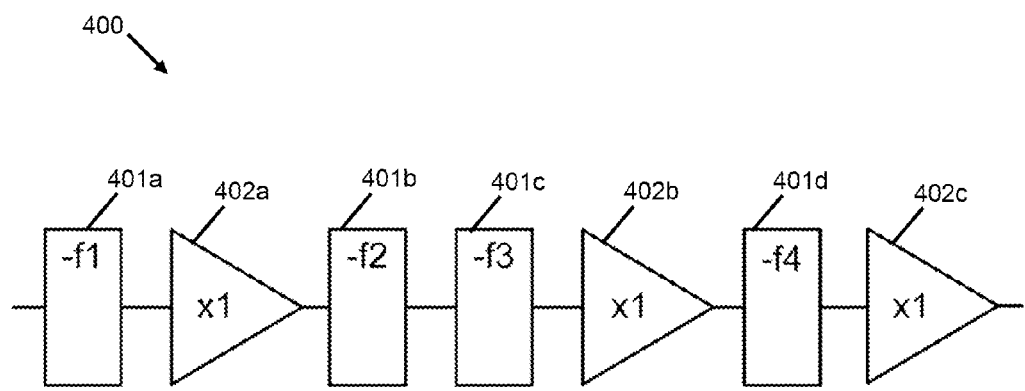
FIGS. 4a and 4b are block diagrams of a polyphase filter for a television tuner.
Figure 4B:
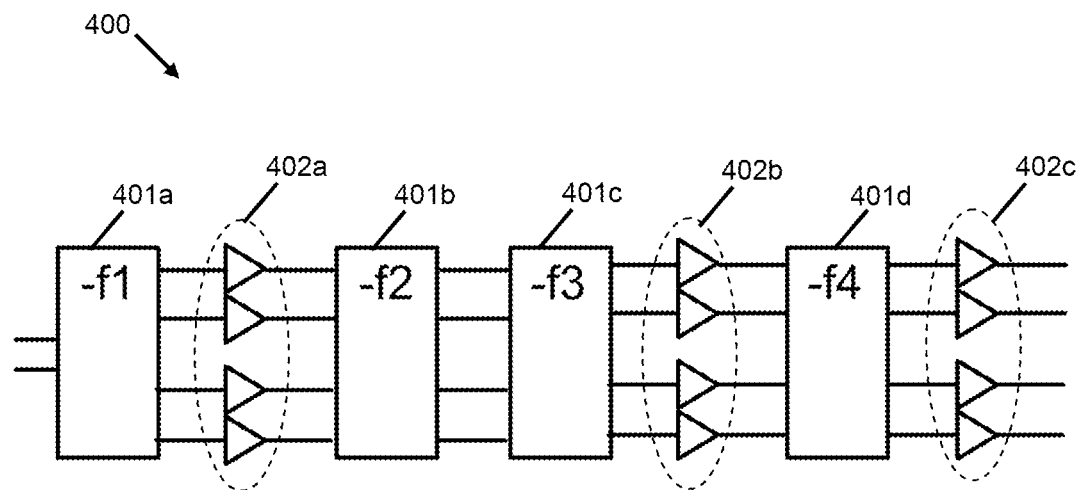
Figure 5:
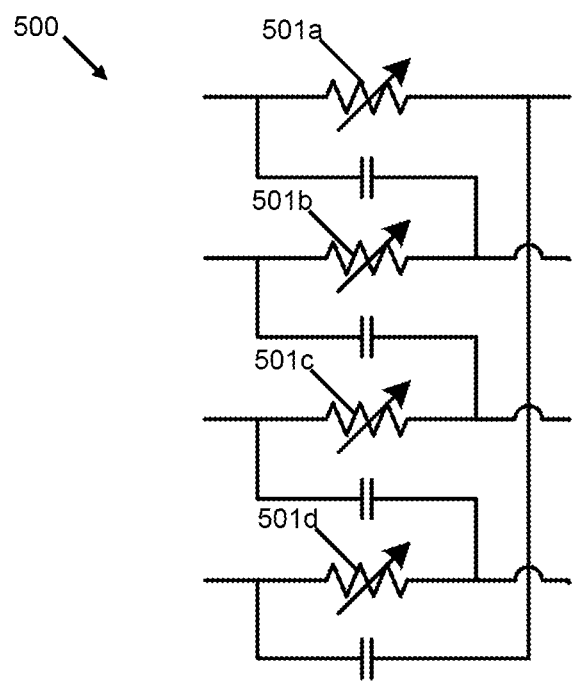
FIG. 5 is a circuit diagram of a passive polyphase filter with a variable notch frequency.
Figure 6:
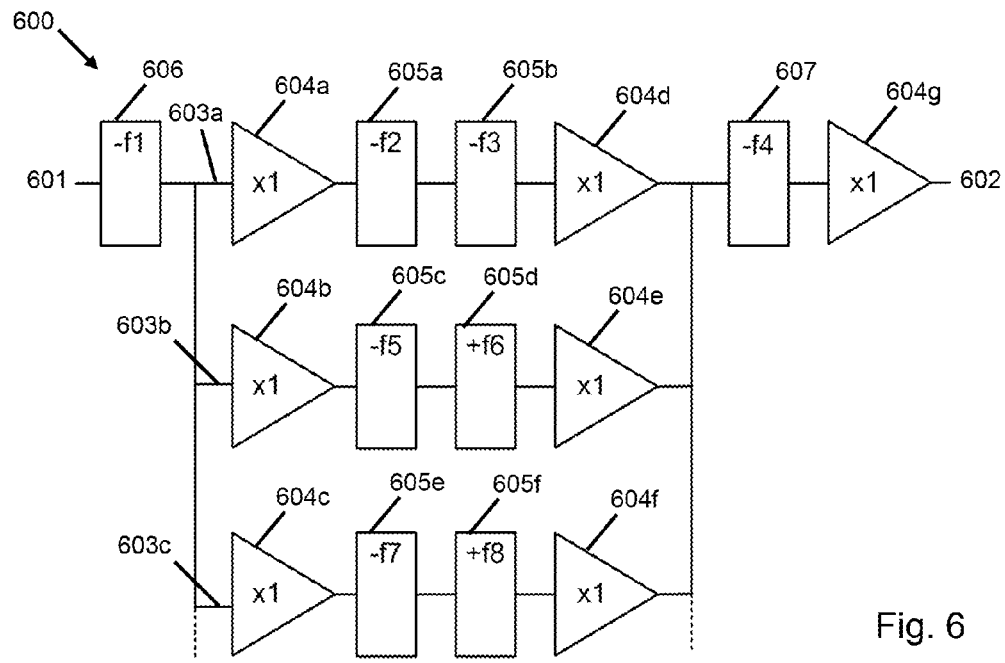
FIG. 6 is a block diagram of a first exemplary embodiment of a programmable filter for a radiofrequency receiver, the filter having parallel paths having polyphase filters in each path.

A block diagram of a first exemplary embodiment of a filter 600 is illustrated in FIG. 6. The filter 600 comprises an input 601 for receiving a radiofrequency signal, and an output 602 for providing a filtered version of the input radiofrequency signal. A plurality of filter paths 603a-c are connected in parallel between the input 601 and the output 602, each filter path 603a-c comprising a first buffer 604a-c connected to the input 601 and to one or more polyphase filters 605a-f. Each of the filter paths 603a-c is configured to be individually selectable by providing an enable signal to a corresponding one of the buffers 604a-c, as described in further detail below.

The filter 600 also comprises an input polyphase filter 606, which filters the input signal 601 and converts the differential input signal 601 to a quadrature signal, which is provided to each of the filter paths 603a-c. Second buffers 604d-f are also provided, connected between the one or more polyphase filters 605a-f in each filter path 603a-c and the output 602. A further output polyphase filter 607 and output buffer 604g are also provided, connected between the second buffers 604d-f of each filter path 603a-c and the output 602.

Each of the buffers 604a-g has a high input impedance and a low output impedance, with the result that the effect of the additional parallel paths on the overall gain of the filter is minimal, and distortion is minimised. The input impedance of the filter 600 is defined by the input polyphase filter 606, which is common to all parallel filter paths 603a-c, resulting in a constant input impedance regardless of which path is selected.

Figure 7:
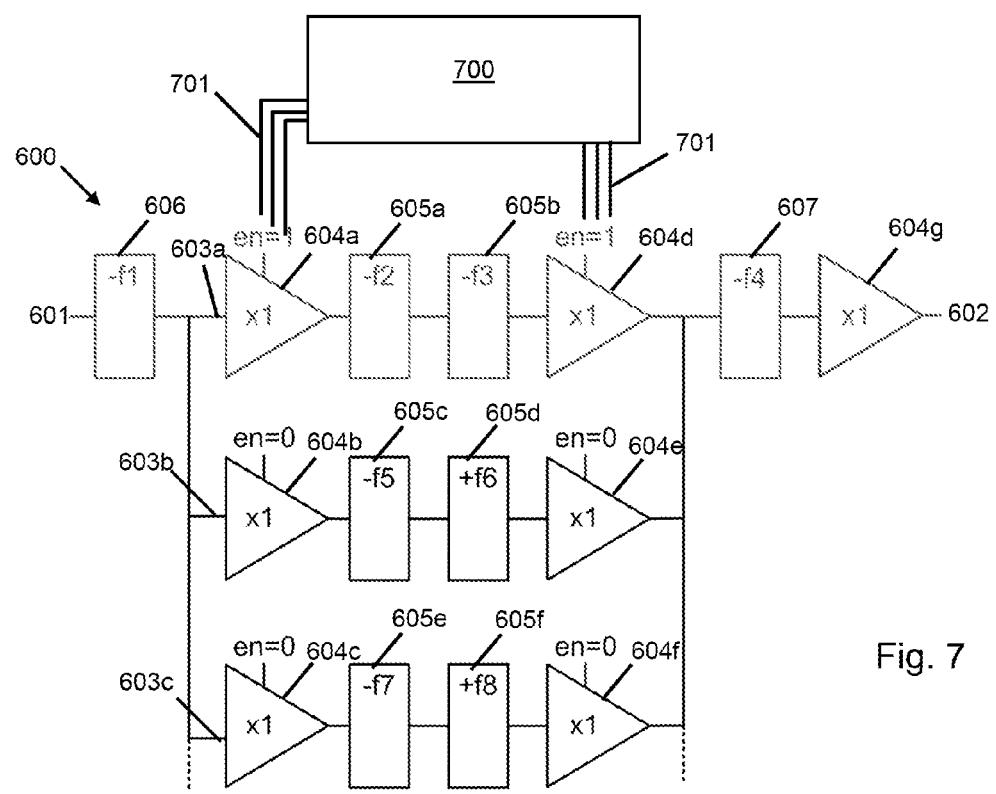
FIG. 7 is a block diagram of the programmable filter of FIG. 6 in a first mode.

FIG. 7 shows the filter 600 of FIG. 6 in a first mode, in which filter path 603a is selected by an enable signal en=1 being provided to first and second buffers 604a, 604d in the filter path 603a. The other filter paths 603b, 603c are disconnected by the first and second unity gain buffers 604b-c, 604e-f being disabled by not being provided with an enable signal. The resulting filter has a transfer function made up of polyphase filters 606, 605a, 605b and 607, all of which comprise negative filter notches. FIG. 7 also depicts a controller module 700, having multiple enable lines 701 connected to enable inputs of buffers 604a-f in each filter path 603a-c (buffer 604g is always enabled). The controller module 700 is configured to provide the enable signal to a selected one (or pair) of the buffers 604a-f in dependence on a selected radiofrequency channel.

Figure 8:
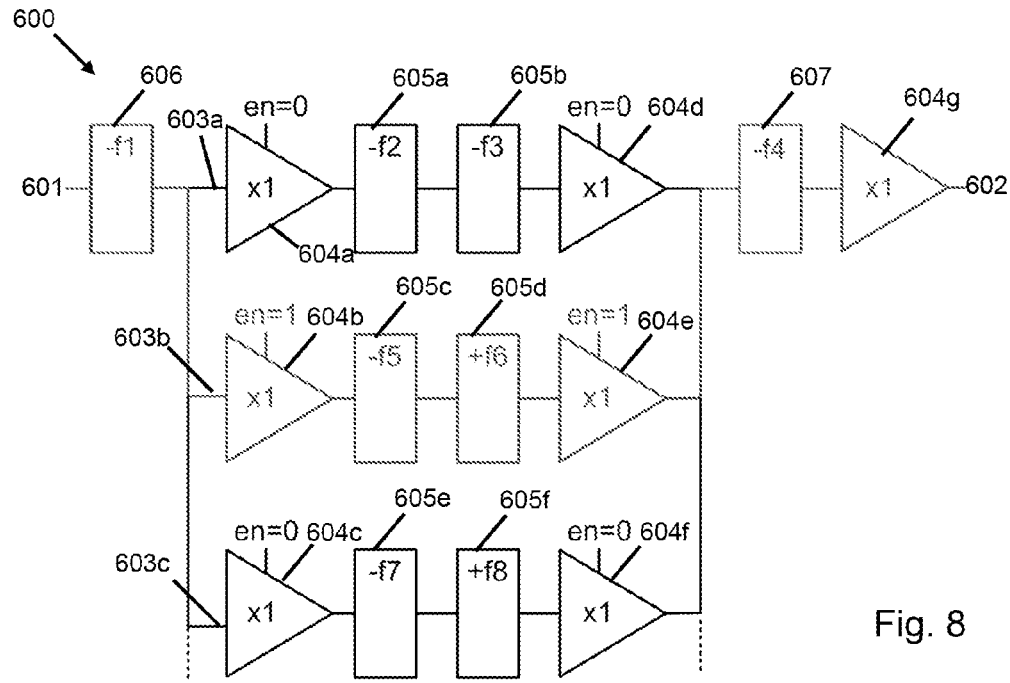
FIG. 8 is a block diagram of the programmable filter of FIG. 6 in a second mode.

FIG. 8 shows the filter 600 of FIG. 6 in a second mode, in which filter path 603b is selected by the enable signal en=1 being provided to first and second buffers 604b, 604e in the filter path 603b. The other filter paths 603a, 603c are disconnected. The resulting filter transfer function has a positive filter notch +f6 in place of a negative filter notch −f3 and a different negative filter notch −f5 in place of negative filter notch −f2. The filter path is otherwise unchanged, resulting in the input and output impedance and the power consumption of the filter remaining constant.

Figure 9:
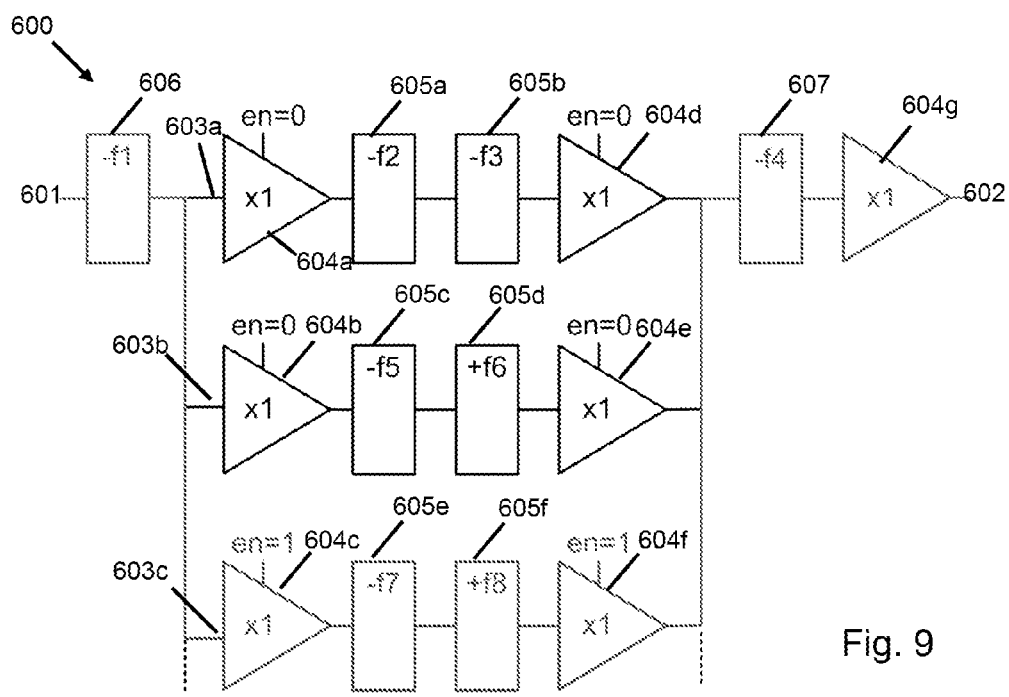
FIG. 9 is a block diagram of the programmable filter of FIG. 6 is a third mode.

FIG. 9 shows the filter 600 of FIG. 6 in a third mode, in which filter path 603c is selected by the enable signal en=1 being provided to first and second buffers 604c, 604f in the filter path 603c. The other filter paths 603a, 603b are disconnected. The resulting filter transfer function has a negative filter notch −f7 and positive filter notch +f8, which is aimed at increasing the bandwidth of the filter 600.

The embodiments in FIGS. 6-9 illustrate filters having three filter paths 603a-c. Other numbers of filter paths may be provided with alternative combinations of filters having positive or negative notches.

Figure 10:
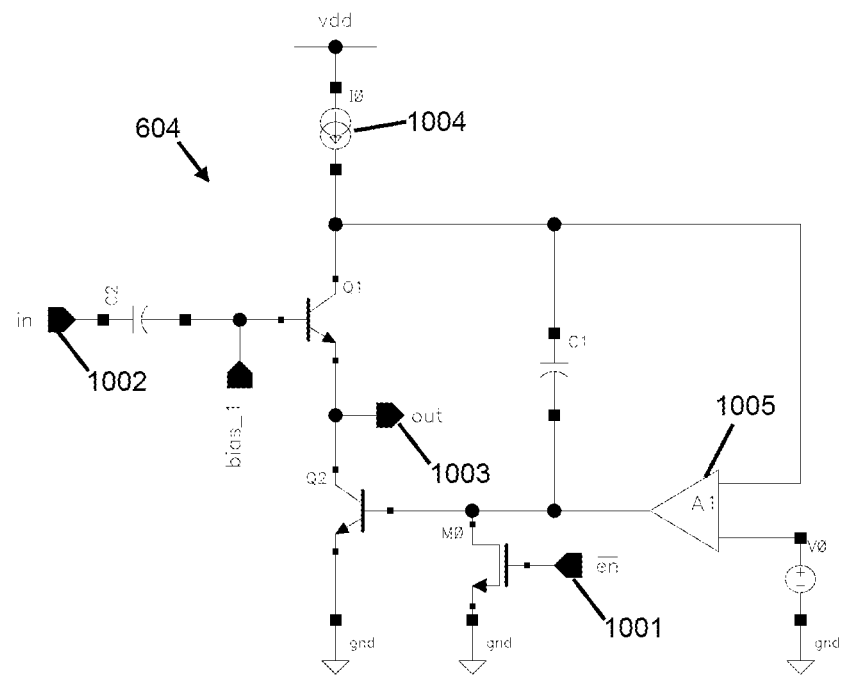
FIG. 10 is a circuit diagram of an exemplary unity voltage gain buffer for use with a programmable filter according to the invention.

A circuit diagram of an exemplary unity voltage gain buffer circuit 604 is illustrated in FIG. 10. The buffer circuit 604 comprises an enable input 1001, which determines whether the buffer circuit 604 is operational, i.e. whether a signal provided at an input 1002 of the buffer circuit 604 is replicated at an output 1003. For use with the exemplary embodiments of FIGS. 6-9, each buffer 604a-g would comprise four of the buffer circuits 604 of FIG. 10, one for each phase of the polyphase connections to and from polyphase filters 605a-f, 606, 607. The same enable signal would be provided to each of buffer circuits 604 to enable a subset of the buffers 604a-g that share a common filter path 603a-c.

The exemplary unity voltage gain buffer circuit 604 comprises a super emitter follower composed of transistors Q1 and Q2. A dc current I0 is provided by a current source 1004. A dc voltage is applied to a bias input 1005 to bias the transistor Q1. Transistor Q2 is biased by a dc control loop comprising a comparator 1005 having inputs connected to a reference voltage V0 and to a collector of transistor Q1. The dc collector voltage of Q1 is thereby compared to the reference voltage V0 by the comparator 1005. The dc base voltage of transistor Q2 is then fixed by the output of the comparator 1005. A further transistor M0, which is connected between the output of comparator 1005 and ground, is used as a switch, under control of the enable signal en (which in FIG. 10 is an inverted signal) used to enable or disable the buffer circuit 604.

When a small signal voltage is applied to the base of transistor Q1, the signal is converted into a collector current by Q1. This current flows into a capacitor C1 connected between the base of transistor Q2 and the collector of transistor Q1, and is amplified by transistor Q2. The output current is composed of the collector current of Q2, and the emitter current of Q1 which is smaller than the collector current of Q2 by the amplification factor (or transistor beta) of Q2. As the collector current of Q1 is small compared to a classical emitter follower, the base-emitter voltage of Q1 is also small, leading to a highly linear unity voltage gain buffer.

Figure 11:
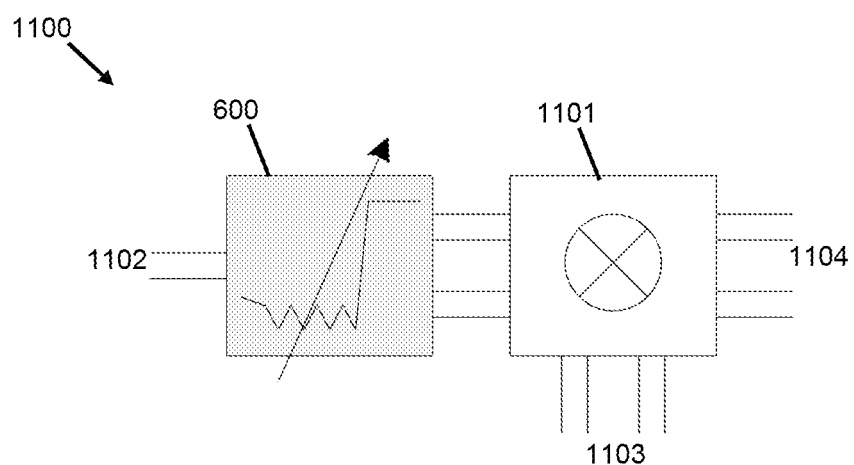
FIG. 11 is a schematic block diagram of a programmable filter in combination with a complex mixer.

A filter 600 according to an embodiment of the invention can be used in conjunction with a complex mixer, as depicted in the receiver 1100 of FIG. 11. The complex mixer receives an output signal from the filter 600 and a local oscillator signal 1103 and mixes these signals to provide an intermediate frequency (IF) signal at an output 1104. In this configuration the polyphase filter 600 of the present invention is used to provide harmonic rejection of an input signal 1102. The transfer function of the filter is programmed according to the RF input frequency of the input signal 1102. If, for example, the RF input frequency is low then 4N−1 harmonic rejection is provided as well as 4N+1 harmonic rejection (where N is a positive integer, i.e. N>0). If the RF input frequency is high then the filter 600 may be programmed to reject only 4N−1 harmonic rejection.

A filter according to the present invention may also be extended to other applications, for example for use in baseband applications to filter out interference during a calibration phase.

Figure 12:
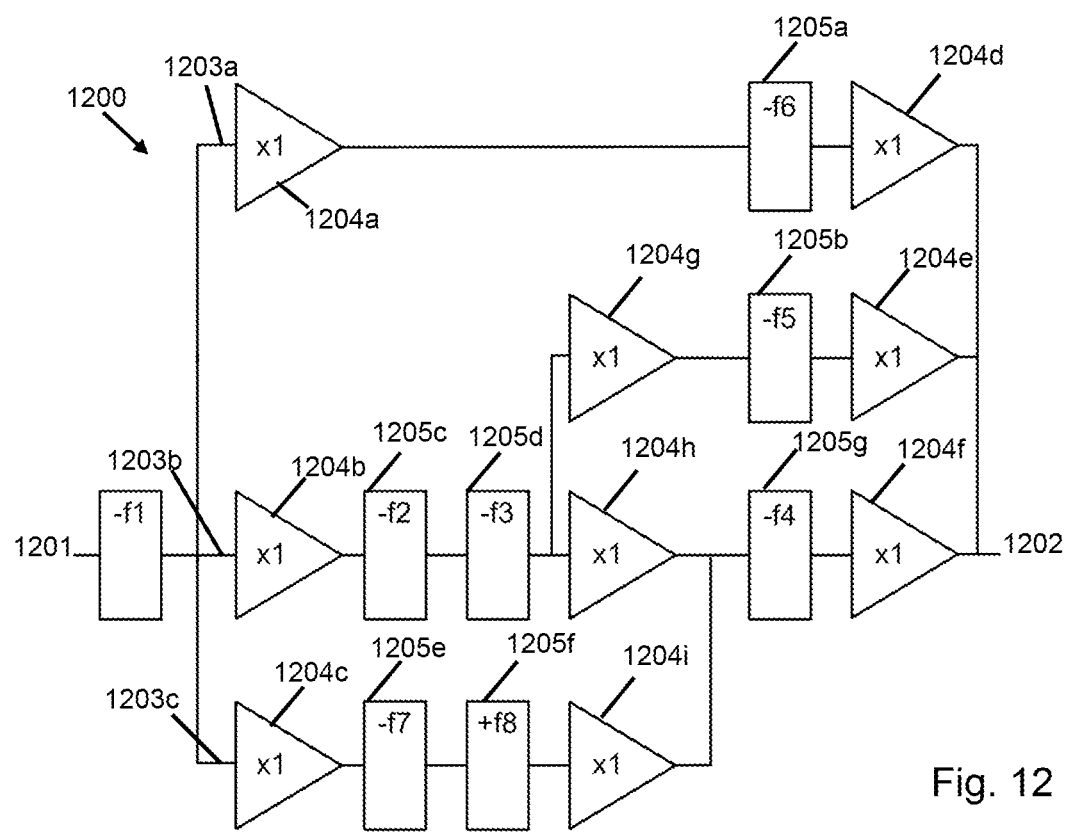
FIG. 12 is a block diagram of a second exemplary embodiment of a programmable filter for a radiofrequency receiver.

An alternative configuration of a polyphase filter 1200 according to a second embodiment of the invention is illustrated in FIG. 12. As with the filter 600 of FIG. 6, a plurality of paths 1203a-c are provided between an input 1201 and output 1202 for an input signal to be filtered, a particular path being selected according to which buffers 1204a-i are enabled. In this embodiment, paths 1203b and 1203c may be partly combined, depending on which of buffers 1204g, 1204h, 1204i and 1204e, 1204f are enabled, allowing for a greater number of combinations of polyphase filters without increasing the total number of filter paths. It can be seen that, with only buffers 1204b, 1204h and 1204f enabled, the filter 1200 is equivalent to the filter 400 of FIG. 4. Selecting buffers 1204g, 1204e instead of buffers 1204h, 1204f exchanges polyphase filter 1205g with negative notch −f4 with polyphase filter 1205*b* with negative notch −f5. Other combinations of polyphase filters are also possible.

Other embodiments are also within the scope of the invention, as defined by the appended claims.

The invention claimed is:

1. A programmable filter for a radiofrequency receiver, the filter comprising:
   an input for receiving a differential input radiofrequency signal;
   an output for providing a filtered version of the differential input radiofrequency signal; and
   a plurality of filter paths connected in parallel between the input and output, each filter path including a buffer and at least one polyphase filter;
   a common polyphase filter configured and arranged receive the differential input radiofrequency signal and output a quadrature signal to the buffer in each of the filter paths; and
   a controller module configured and arranged to individually select one of the plurality of filter paths to provide the filtered version of the input radiofrequency signal to the output by providing an enable signal to the buffer in the selected filter path.

2. The filter of claim 1 wherein the one or more polyphase filters in the filter paths include positive or negative notch filters.

3. The filter of claim 1 wherein the programmable filter is configured to provide the quadrature signal at the output.

4. The filter of claim 1 wherein the polyphase filter is a passive polyphase filter.

5. The filter of claim 1 wherein the buffer of each filter path is configured to have a unity voltage gain when enabled by the enable signal.

6. The filter of claim 5 wherein the buffer of each filter path is configured to isolate the filter path from the input when the buffer is not enabled.

7. The filter of claim 1 wherein the buffer of each filter path is a first buffer and each filter path includes a second buffer connected between the at least one polyphase filter and the output of the filter.

8. The filter of claim 7 wherein the second buffer of each filter path is configured to have a unity voltage gain when enabled by an enable signal.

9. The filter of claim 8 wherein the second buffer of each filter path is configured to isolate the filter path from the output when not enabled.

10. The filter of claim 1 wherein the at least one polyphase filter in each filter path includes a positive or negative notch filter.

11. The filter of claim 1 further comprising a controller module coupled to the buffer of each filter path and configured to provide the enable signal to a selected one of the buffers in dependence on a selected radiofrequency channel.

12. The filter of claim 1 wherein each buffer comprises a buffer circuit for each phase of the filter path.

13. A radiofrequency receiver comprising a filter according to claim 1 and a mixer, an input of the mixer connected to the output of the filter and to a local oscillator signal source for converting a selected radiofrequency signal to an intermediate frequency signal.

14. A method of operating a programmable filter for a radiofrequency receiver according to claim 13, the method comprising:
   receiving a radiofrequency signal at the input of the filter;
   selecting one of the filter paths by providing an enable signal to one of the buffers; and
   providing a filtered output signal at the output of the filter.

15. A programmable filter for a radiofrequency receiver, the programmable filter comprising:
   a common polyphase filter configured and arranged receive a differential input radiofrequency signal and output a quadrature signal;
   a plurality of filter paths connected in parallel to the common polyphase filter and including at least one polyphase notch filter arranged in each of the plurality of filter paths;
   a plurality of buffers, including at least one of the plurality of buffers arranged in each filter path, each of the at least one buffer in each filter path being configured and arranged to receive the quadrature signal output from the common polyphase filter;
   a controller module configured and arranged to individually select one of the plurality of filter paths to provide a filtered version of the input radiofrequency signal by providing an enable signal to the at least one buffer in the selected filter path; and
   an output polyphase filter configured and arranged to output the filtered version of the input radiofrequency signal.

16. The programmable filter of claim 15, wherein the at least one of the plurality of buffers arranged in each filter path is further configured and arranged to include a high input impedance and a low output impedance.

17. The programmable filter of claim 15, wherein at least one of the plurality of filter paths includes a positive notch filter and negative notch filter.

* * * * *